United States Patent [19]
Matsumoto

[11] Patent Number: 5,925,948
[45] Date of Patent: *Jul. 20, 1999

[54] AXIAL FLOW FAN MOTOR

[75] Inventor: Kaoru Matsumoto, Nagano-ken, Japan

[73] Assignee: Minebea Co., Ltd., Nagano, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/777,048

[22] Filed: Dec. 30, 1996

[30] Foreign Application Priority Data

Feb. 19, 1996 [JP] Japan ..................... 8-055460

[51] Int. Cl.$^6$ .......................... H02K 29/00; H02K 11/00
[52] U.S. Cl. ...................... 310/67 R; 310/71; 310/68 C; 310/216
[58] Field of Search ..................... 310/67 R, 71, 310/68 C, DIG. 6, 216, 217, 218, 194, 254, 258; 324/511; 340/611; 361/103, 25

[56] References Cited

U.S. PATENT DOCUMENTS

| 4,554,491 | 11/1985 | Plunkett | 310/62 |
|---|---|---|---|
| 4,633,110 | 12/1986 | Genco et al. | 310/71 |
| 4,656,553 | 4/1987 | Brown | 361/31 |
| 4,730,136 | 3/1988 | Mueller | 310/68 R |
| 4,804,873 | 2/1989 | Shiraki et al. | 310/67 R |
| 5,008,573 | 4/1991 | Beppu et al. | 310/67 R |
| 5,256,922 | 10/1993 | Tanaka et al. | 310/71 |
| 5,436,519 | 7/1995 | Takahashi et al. | 310/217 |

*Primary Examiner*—Thomas M. Dougherty
*Assistant Examiner*—Burton Mullins
*Attorney, Agent, or Firm*—Oliff & Berridge, PLC

[57] ABSTRACT

To reduce the number of parts composing a control circuit and to reduce an area occupied by a printed circuit board on which the parts are to be mounted, in an axial flow fan motor in which a shaft is rotatably mounted by bearings and an impeller is mounted on the shaft, the control circuit is in the form of an arcuate shape having an area corresponding to 30% to 60% of an total area of the boss portion and is installed into a printed circuit board having a diameter smaller than that of the boss portion. Also, by utilizing the functions installed into the integrated circuit of the control circuit, the parts provided on the circuit board may be dispensed with. As a result, a space which corresponds to that of the printed circuit board is generated in an interior of a casing to thereby enhance the cooling performance and to reduce the number of the parts and the manufacture steps.

1 Claim, 9 Drawing Sheets

AXIAL FLOW FAN MOTOR

BACKGROUND OF THE INVENTION

1. Field of the Invention

The present invention relates to an improvement in an axial flow fan motor installed in a variety of OA (office automation) instruments or the like.

2. Description of the Related Art

In the equipment such as various OA instruments encasing a plurality of electronic circuits, there is a risk that the residual heat generated from the electronic parts may cause the damage of the electronic parts. Accordingly, a ventilation hole is provided in side walls of the casing, and the axial fan motor is mounted therein, thereby radiating the internal heat to the outside.

One example of an axial fan motor which has been conventionally used will now be described with reference to FIG. 9. Reference numeral 1 denotes a casing which is composed of a cylindrical venturi portion 2 having a slanted surface therein and a bearing box portion 3 formed integrally with the venturi portion 2. A pair of bearings 4 and 5 are mounted on the inner side of raised portions of the axial bearing box portion 3. The inner races of the bearings 4 and 5 support rotatably a shaft 6 made of metal. Reference numeral 7 denotes a retainer ring for preventing it from getting out of the shaft 6.

Figure 9:
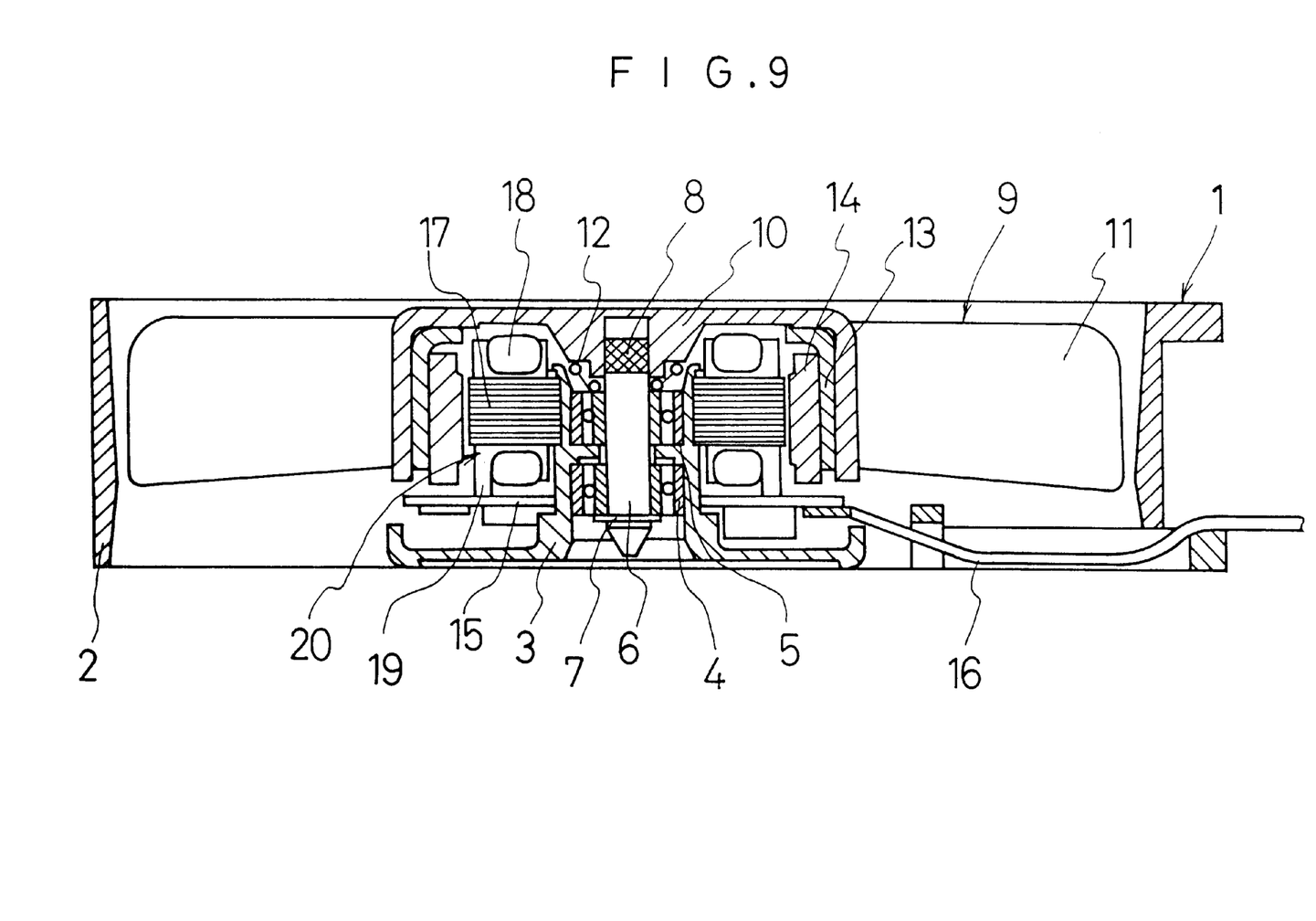
FIG. 9 is a longitudinal sectional view showing a conventional example of an axial flow fan motor.

A knurling (D-cut) 8 is formed on an upper portion of the shaft 6 in FIG. 9. A central portion of a boss portion 10 of an impeller 9 is secured on the knurling. In order to secure the shaft 6 on the boss portion 10, the shaft 6 is inserted when the impeller 9 is molded. A plurality of fans 11 are radially mounted around an outer circumferential portion of the boss portion 10. The impeller 9 is inserted into the bearings 4 and 5 while being integrally formed with the shaft 6. Reference numeral 12 denotes a coil spring for providing a suitable thrust prepressure to the inner race of the bearing 5.

The boss portion 10 of the impeller 9 is shaped into a letter of E as shown in cross section in FIG. 9 and the fans 11 are mounted on the outer circumferential portion thereof. A yoke 13 is mounted on the inner side of the boss portion 10 for holding a cylindrical magnet 14 which has been magnetized in the circumferential direction. A disc-like printed circuit (PC) board 15 is mounted on the outer circumferential portion of the raised portion of the bearing box portion 3. As described later, the electronic circuits and parts are mounted as a DC brushless motor. Reference numeral 16 denotes a lead line for supplying the electronic circuits with electric power from the power source. A stator 20 is composed of a core 17, a coil 18 wound around the core 17, and an insulator 19 for holding the core 17, which is mounted at the position of the upper portion of the PC board and the inside of the magnet 14.

Figure 10:
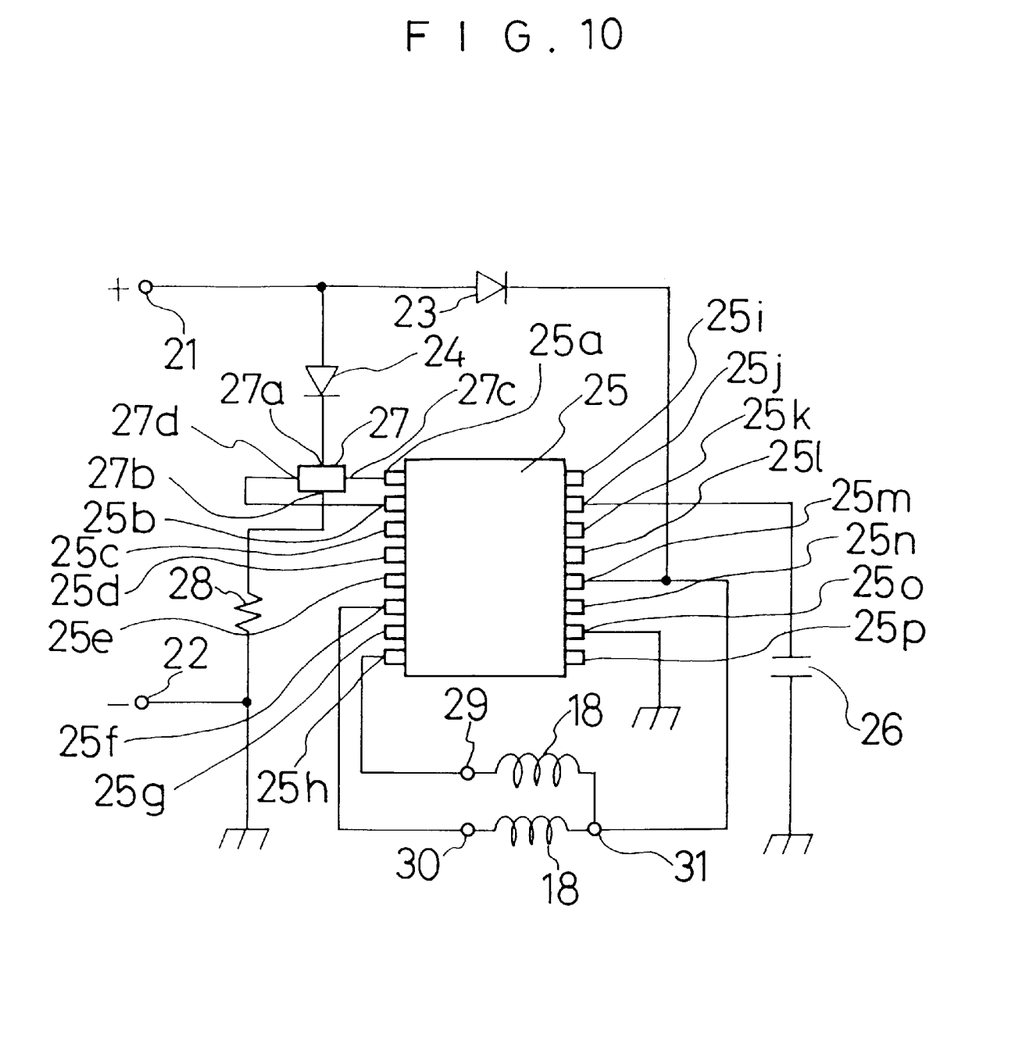
FIG. 10 is a circuit diagram showing a conventional drive circuit of the motor.

FIG. 10 is a diagram showing a drive circuit of the motor. Reference numeral 21 is a source terminal on a plus side. Reference numeral 22 denotes a source terminal on a minus side. The source terminal 22 is connected to a ground circuit. These source terminals 21 and 22 are connected to the lead line 16 (see FIG. 11). Cathode sides of diodes 23 and 24 are connected to the source terminal 21. An anode side of the diode 23 is connected to a terminal 25m of an integrated circuit (IC) 25.

Sixteen terminals 25a through 25p are provided in the integrated circuit 25. Although these terminals are the source terminals on the plus and minus sides and the input/output terminals for transmitting signals, parts of them are used as the drive circuit of the motor. The terminal 25o is connected to the ground circuit, and a capacitor 26 is connected between the terminal 25j and the ground circuit.

An anode of the diode 24 is connected to a source terminal 27a on the plus side of the hall device 27 for detecting a magnetic field of the rotor. A source terminal 27b on the minus side of the hall device 27 is connected to the ground circuit via a resistor 28. Output terminals 27c and 27d of the hall device 27 are connected to the terminals 25a and 25b of the integrated circuit 25, respectively. Coils 18 and 18 are connected between the terminals 25f and 25m and between the terminals 25h and 25m. Reference numerals 29, 30 and 31 denote connector terminals of the coils 18 and 18. The hall device 27 and the integrated circuit 25 are operative to control a current flowing through the coils 18 and 18 and to rotate the impeller 9 in a predetermined direction.

The thus constructed axial flow motor will operates as follows. Namely, when the power source voltage is fed to the source terminals 21 and 22 through the lead line 16, the current flows through the coils 18 and 18 by the action of the integrated circuit 25, s0 that the cores 17 of the stator 20 are excited in predetermined order. As a result, the impeller 9 is rotated around the shaft 6 due to the relationship between the magnetic field generated by the excited coil 17 and the magnetic field generated by the magnet 14. By this rotation, the fans 11 generates an air flow in a constant direction within the venturi portion 2 of the casing 1. Accordingly, it is possible to emit the heat to the outside, held within the casing encasing the axial flow fan motor.

When the current is caused to flow through the coils 18 and 18, a charging current corresponding to a value of that current will flow through the capacitor 26, so that the capacitor 26 is charged. When a rotation obstruction is occurred due to certain causes, the motor falls into a locked state, so that a large force is applied to the shaft 6, then, the charging voltage to be applied to the capacitor 26 is abruptly increased. When this voltage exceeds a certain level, the integrated circuit 25 cuts off the current flowing through the coils 18 and 18 to prevent the burnout of the coils 18 and 18.

Figure 11:
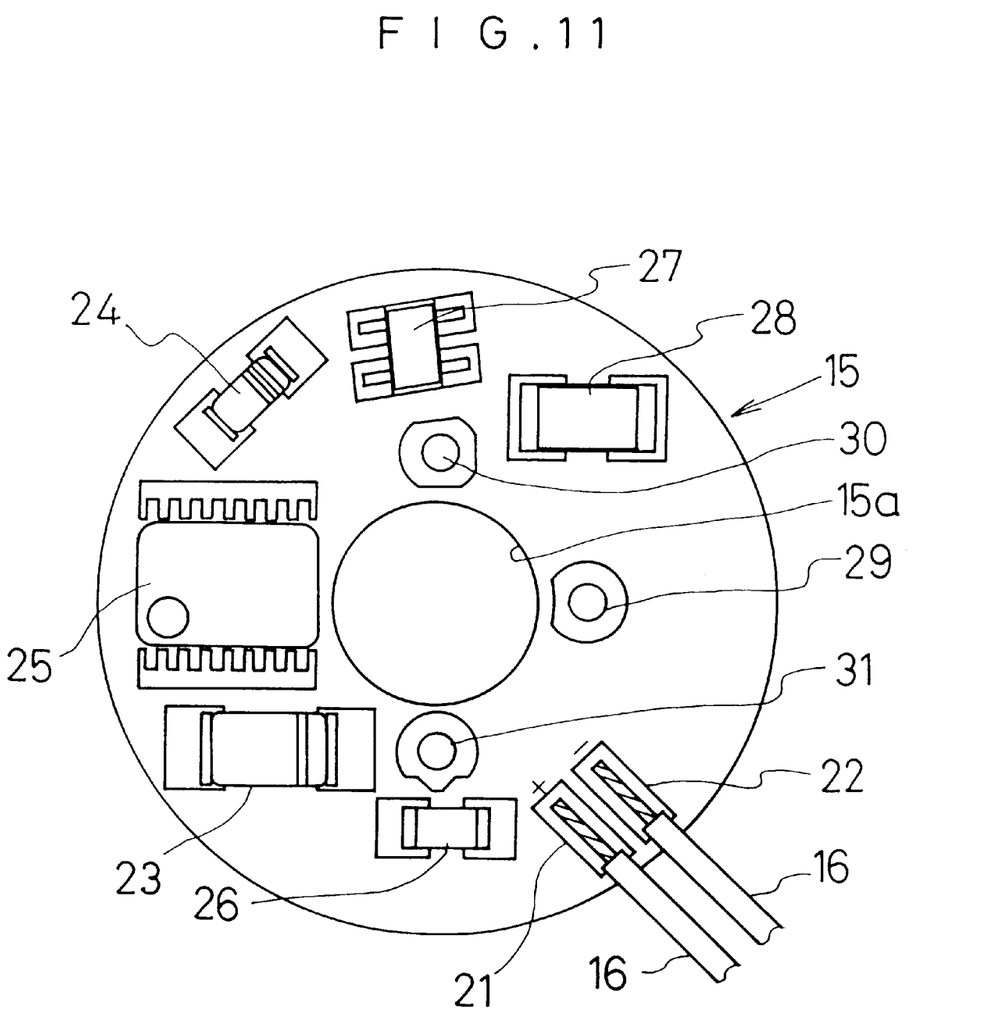
FIG. 11 is a plan view showing an arrangement in which circuit parts shown in FIG. 10 are arranged on the printed circuit board.

FIG. 11 is a view showing an arrangement of parts of the electronic circuit shown in FIG. 10 on the PC board 15. As is apparent from FIG. 11, the PC board 15 is formed into a circular shape and is provided at its center with a circular hole 15a. The bearing box portion 3 penetrates the hole 15a. In FIG. 11, the same reference numerals are used to indicate the same components as shown in FIG. 10. These components attached to the PC board 15 are arranged to occupy an area approximately three fourths of the total area of the boss portion.

In the case where the above-described axial flow fan motor is applied to an OA equipment or the like, since the air is caused to flow along the shaft 6 by the impeller 9, by mounting the shaft 6 of the axial flow fan motor perpendicular to the wall of the casing of the OA equipment or the like, it is possible to effectively emit, to the outside, the air which has been heated within the casing. Therefore, there is an effect to restrict the temperature to be increased within a certain range. Namely, there is no problem in respect of the function of the fan motor, however, it has been required to curtail the cost and to further miniaturize the fan motor while keeping the same reliability and function as it is. Also, as one of the countermeasures for reducing the number of the mechanical parts, the capacitor 26, which functions when an excessive force is applied to the shaft 6 by some rotation hindrance, may be dispensed with, if this function is attained by another component.

SUMMARY OF THE INVENTION

In view of the above-noted defects, an object of the present invention is to provide an axial flow fan motor in which the number of the parts comprising the device is reduced and the arrangement is improved, thereby further curtailing the cost and making the size thereof compact while keeping the reliability and function as it is.

In order to attain this and other objects, according to the invention described in the claim 1, there is provided an axial flow fan motor wherein an impeller is mounted through a circular boss portion on a shaft rotatably supported by bearings, and a rotation of the shaft is controlled by a power supply control of coils by the action of an integrated circuit, characterized in that a control circuit is installed in a printed circuit board having a diameter smaller than that of the boss portion in an arcuate shape having an area within 30% to 60% of the total area of the boss portion.

In the invention of the claim 2, based on the invention described in the claim 1, terminals of coils of a stator are provided at an outermost circumference of the stator and between the adjacent stator elements, holes are formed at positions corresponding to positions of the terminals of the printed circuit board, and the terminals are inserted into the holes and connected to the holes.

In the invention of the claim 3, based on the invention described in the claim 1, a plurality of terminals of coils of the stator are provided for one polarity of the stator, holes are formed at positions corresponding to the positions of the terminals of the printed circuit board, and the terminals are inserted into the holes and connected to the holes.

In the invention of the claim 4, based on the invention described in the claim 1, the integrated circuit board for controlling the power supply to the coils is of a type having a thermal shutdown function, and an operating temperature of the thermal shutdown function is set at a temperature lower by about 10° C. to 80° C. than a maximum allowable junction temperature generated when the motor falls into a locked state.

According to the invention in the claim 1, the control circuit is installed in the printed circuit board having the diameter smaller than that of the boss portion in the arcuate shape having an area within 30% to 60% of the total area of the boss portion, whereby when the motor is installed into the interior of the casing, it is possible to occupy the broad internal space of the casing to thereby enhance the air ventilation property and to improve in flow performance of cooling air.

According to the inventions in the claims 2 and 3, the parts arrangement of the printed circuit board is contrived so that the connection between the coils on the stator side and the board side may be certainly facilitated with the small number of the parts.

According to the invention described in the claim 4, when the motor falls into a locked state due to the rotation obstruction and a large force is applied to the shaft, the integrated circuit detects this phenomenon and functions to prevent the motor from being burnt out.

EMBODIMENT OF THE INVENTION

One embodiment of the invention in which an area occupied by the electronic parts is reduced down to 50% of the total area of the boss portion will now be described with reference to FIG. 1. In this case, the same reference numerals are used to indicate the same members or components as in FIG. 9. Reference numeral 1 denotes a casing which is composed of a cylindrical venturi portion 2 having a slanted surface therein and a bearing box portion 3 formed integrally with the venturi portion 2. A pair of bearings 4 and 5 are mounted on the inner side of raised portions of the axial bearing box portion 3. The inner races of the bearings 4 and 5 support rotatably a shaft 6 made of metal. Reference numeral 7 denotes a retainer ring for preventing it from getting out of the shaft 6.

Figure 1:
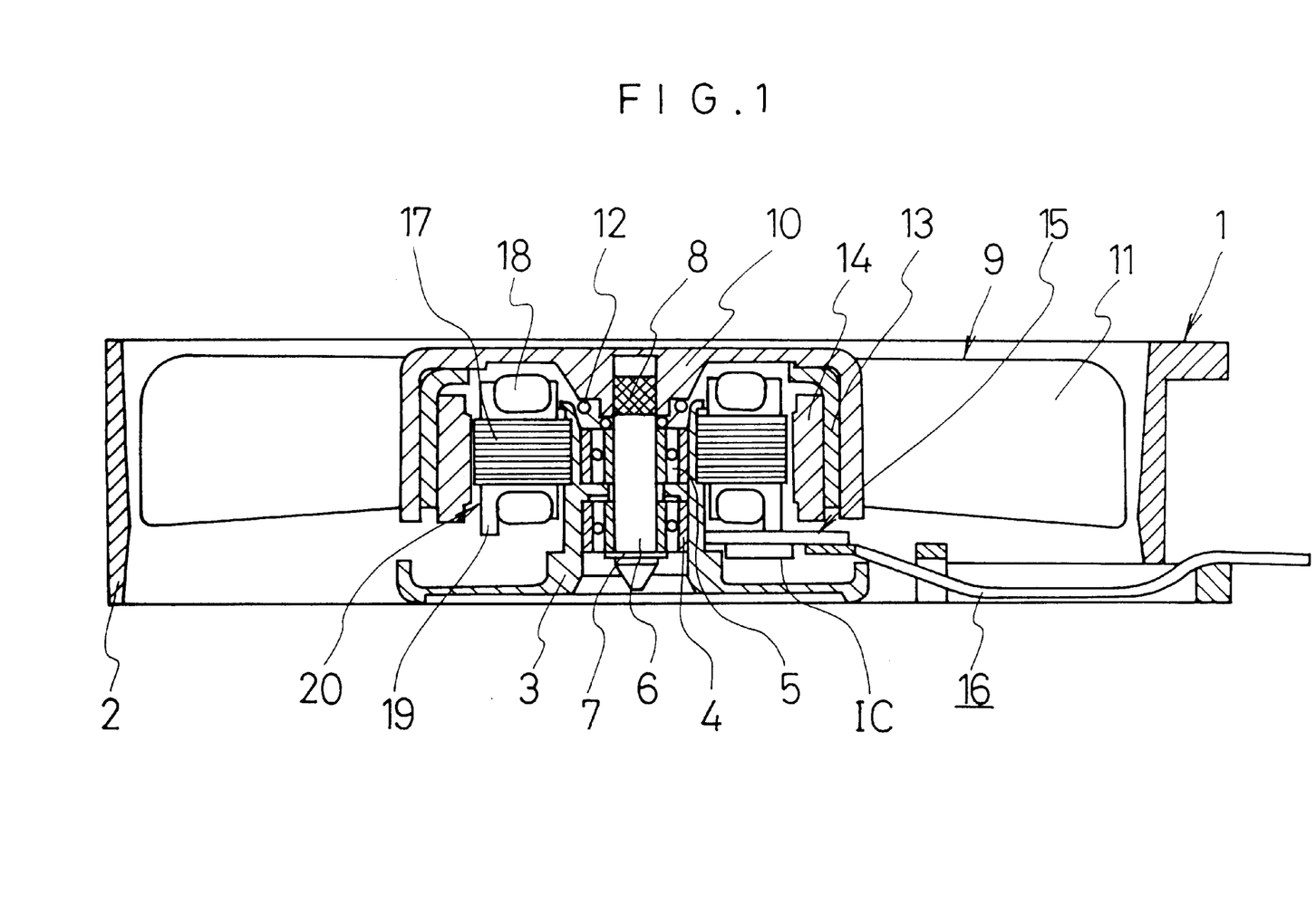
FIG. 1 is a longitudinal sectional view showing one embodiment of the invention.

As shown in FIG. 1, the shaft 6 is molded integrally with a central portion of a boss portion of an impeller 9. The impeller 9 is made of synthetic resin. A plurality of fan vanes 11 are mounted on the outer circumferential portion of the boss portion 10. The impeller 9 is inserted into the bearings 4 and 5 along the shaft 6.

The boss portion 10 of the impeller 9 is shaped into a letter of E as shown in cross section in FIG. 1 and the fan vanes 11 are mounted on the outer circumferential portion thereof. A yoke 13 is mounted on the inner side of the boss portion 10 for retaining a cylindrical magnet 14 which has been magnetized in the circumferential direction. A semicircular printed circuit (PC) board 15 is mounted on the outer circumferential portion of the raised portion of the bearing box portion 3. As described later, the electronic circuits and parts are mounted as a DC brushless motor. Reference numeral 16 denotes a lead line for supplying the electronic circuits with electric power from the power source. A stator 20 is composed of a core 17, a coil 18 wound around the core 17, and an insulator 19 for holding the core 17, which is mounted at the position of the upper portion of the PC board and the inside of the magnet 14.

Figure 2:
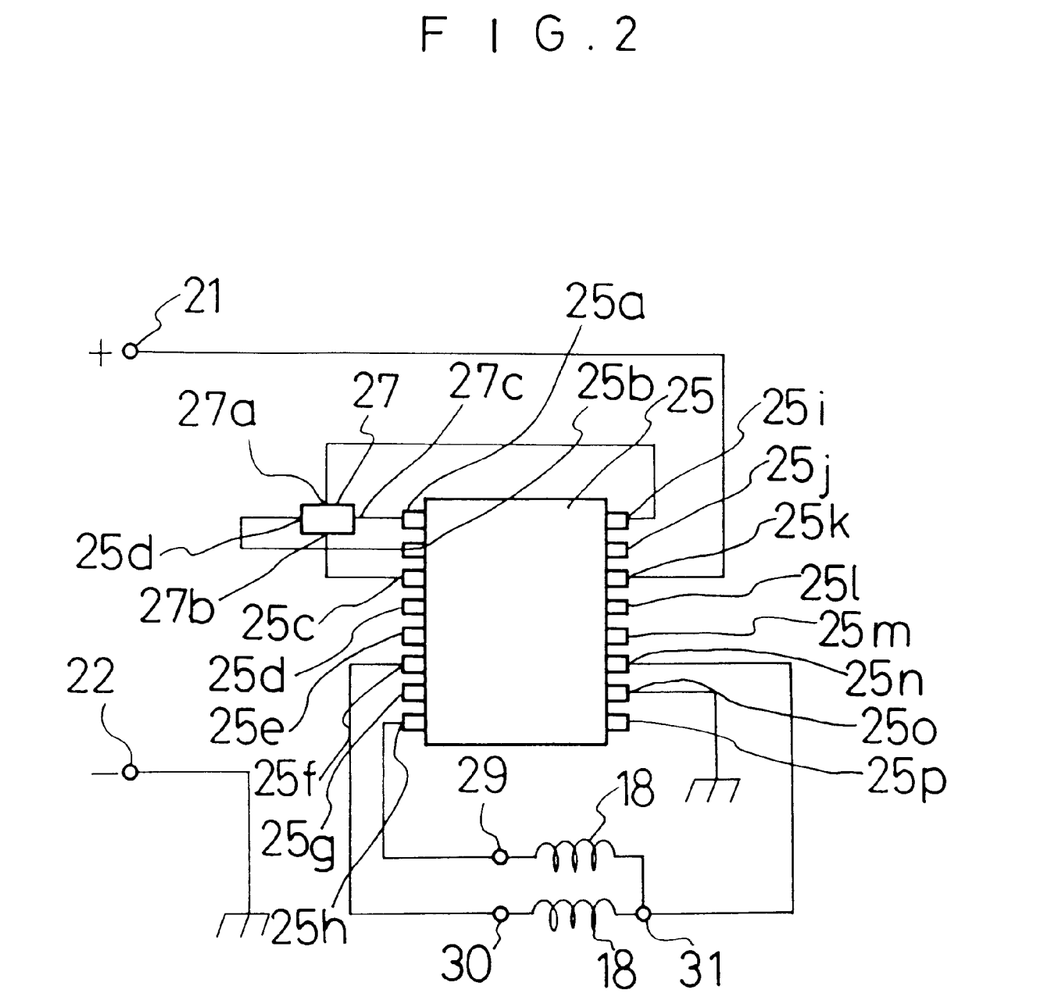
FIG. 2 is a circuit diagram showing a drive circuit of a motor.

FIG. 2 is a diagram showing a drive circuit of the motor. Reference numeral 21 is a source terminal on a plus side. Reference numeral 22 denotes a source terminal on a minus side. The source terminal 22 is connected to a ground circuit. These source terminals 21 and 22 are connected to the lead lines. A terminal 25k of an integrated circuit 25 is connected to the source terminal 21. What corresponds to the diode 23 shown in FIG. 10 is included into the interior of the integrated circuit 25, i.e. the portion between the terminal 25k and a terminal 25m. The integrated circuit 25 has a thermal shutdown function in its interior.

A source terminal 27a on the plus side of a hall device 27 is connected to a terminal 25i of the integrated circuit 25.

What corresponds to the diode 24 shown in FIG. 10 is included into the interior of the integrated circuit 25, i.e. the portion between the terminal 25i and the terminal 25k. A source terminal 27b on the minus side of the hall device 27 is connected to a terminal 25c of the integrated circuit 25. What corresponds to the resistor 28 shown in FIG. 10 is included into the interior of the integrated circuit 25, i.e., the portion between the terminal 25c and a terminal 25o. With such a connection between the hall device 27 and the integrated circuit 25 described in the above, the integrated circuit 25 is adapted to always apply about 1 to 3 voltage to the terminals 27a and 27b of the hall device 27.

Output terminals 27c and 27d of the hall device 27 are connected to the terminals 25a and 25b of the integrated circuit 25, respectively. Coils 18 and 18 are connected between the terminals 25f and 25m and between the terminals 25h and 25m, respectively. Reference numerals 29, 30 and 31 denote connector terminals of the coils 18 and 18. The hall device 27 and the integrated circuit 25 are operative to control a current flowing through the coils 18 and 18 and to rotate the impeller 9 in a predetermined direction.

Figure 3:
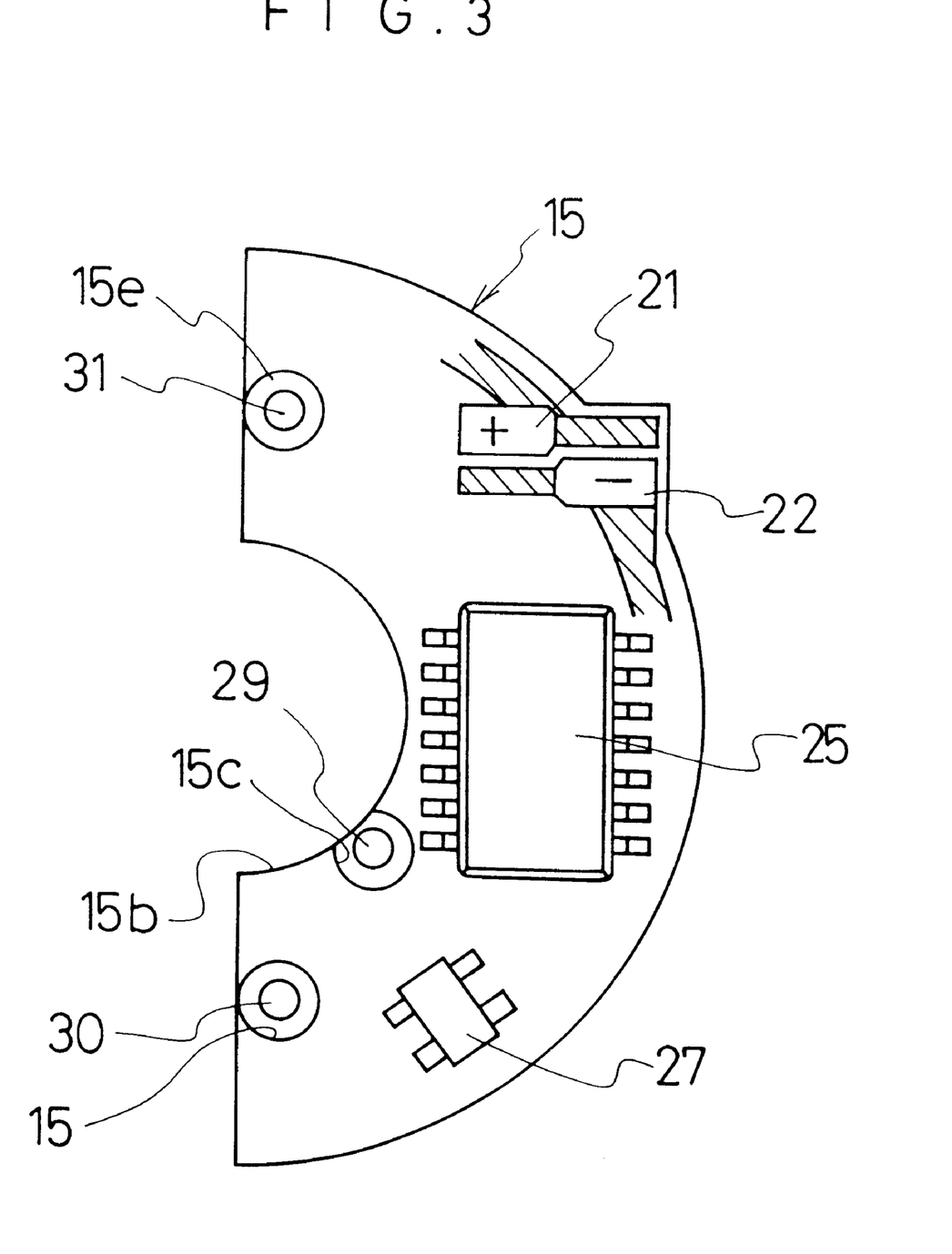
FIG. 3 is a plan view showing an arrangement of circuit parts shown in FIG. 2 on a printed circuit board.
Figure 4:
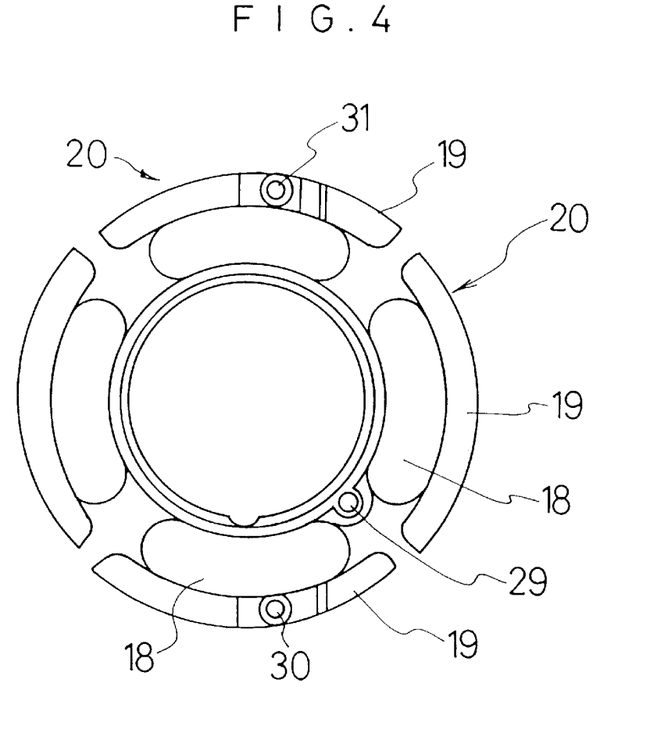
FIG. 4 is a plan view showing the motor.
Figure 5:
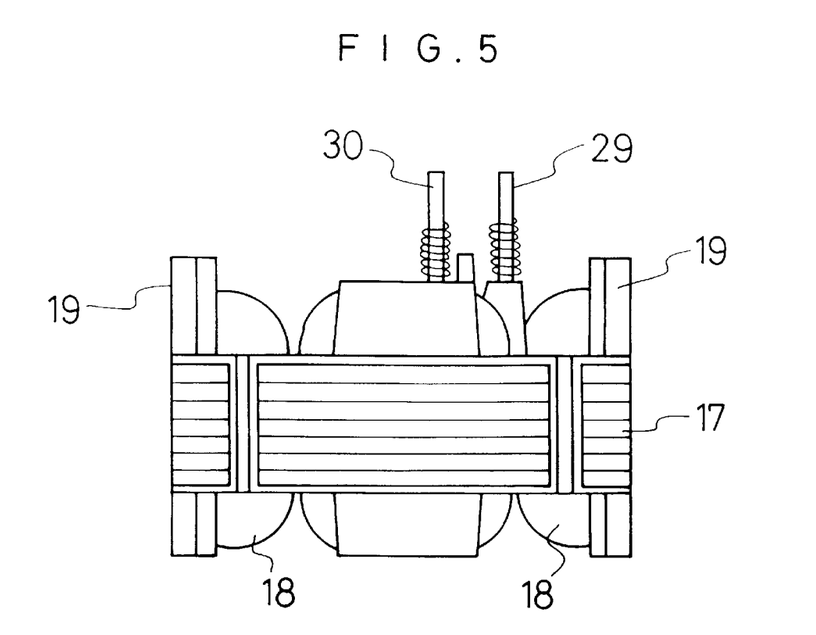
FIG. 5 is a frontal view showing the motor.

FIG. 3 is a view showing the arrangement of the circuit parts shown in FIG. 2 on the PC board 15. As is apparent from FIG. 3, the PC board 15 is in the form of a semicircular shape and is concentrically provided with a semicircular recess 15b. The recess 15b faces a part of the bearing box portion 3. In the PC board 15 shown in FIG. 2, the same reference numerals are used to indicate the same components. In this embodiment, as shown in FIGS. 4 and 5, the terminals 29, 30 and 31 of the coils of the stator 20 are provided at the outermost circumference of the stator 20 (i.e., at the portions of the insulators 19) and between the adjacent stators 20 (at the portions of the coils 18). At the same time, holes 15c, 15d and 15e are formed at positions corresponding to the positions of these terminals 29, 30 and 31. Then, the terminals 29, 30 and 31 are inserted into these holes 15c, 15d and 15e and are connected to the respective circuits by soldering.

Figure 6:
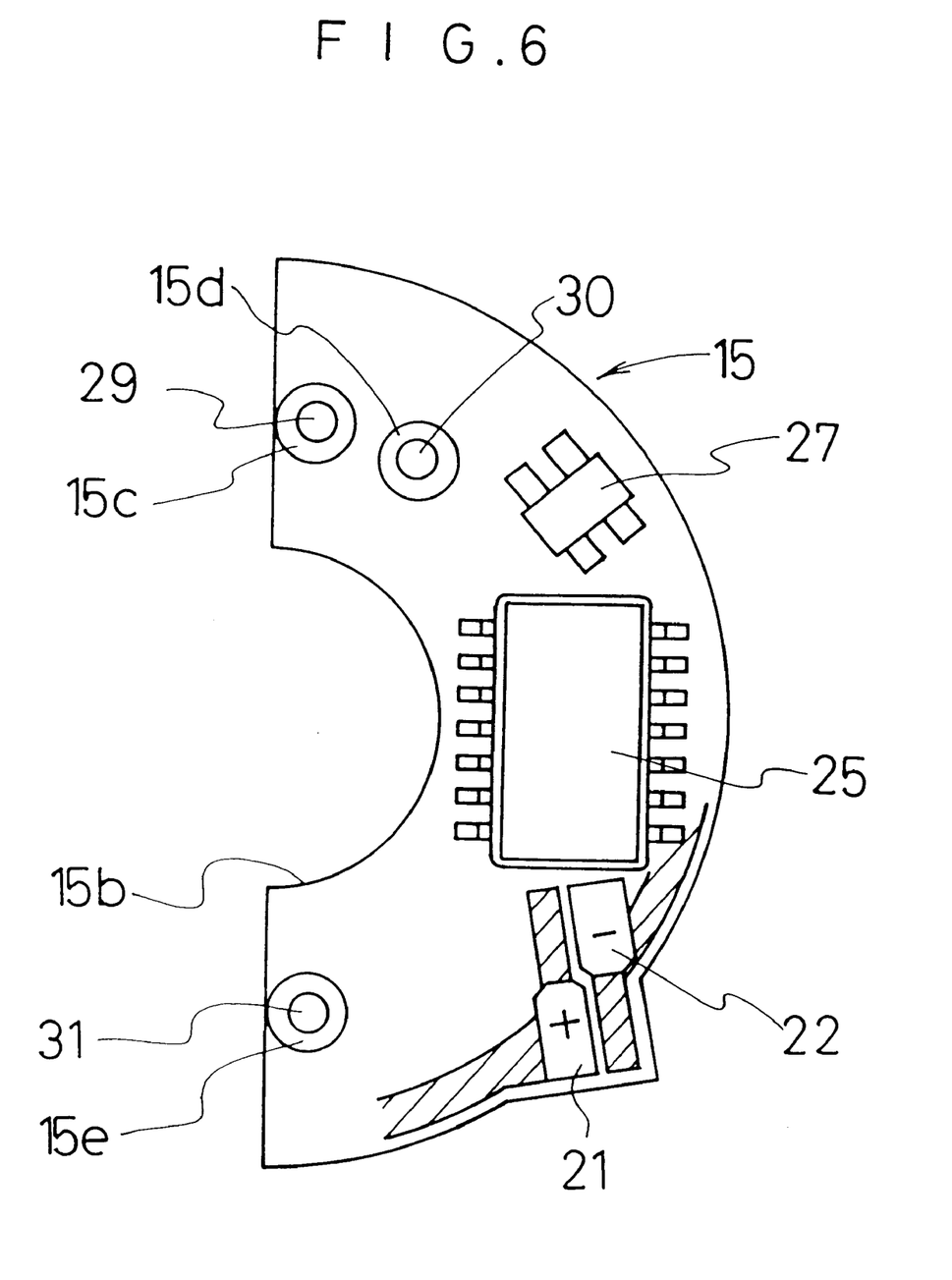
FIG. 6 is a plan view showing another example in which the circuit parts shown in FIG. 2 are arranged on the printed circuit board.
Figure 7:
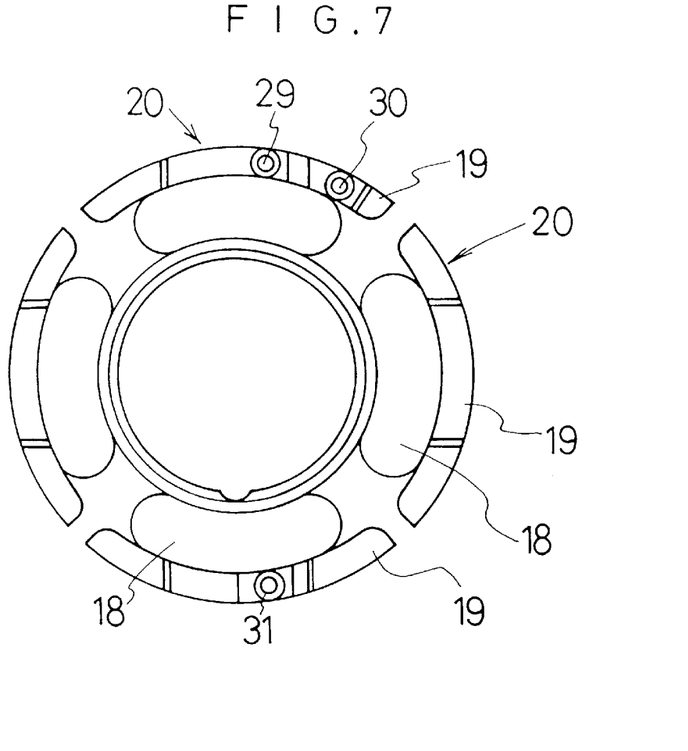
FIG. 7 is a plan view showing the modification to that shown in FIG. 4.
Figure 8:
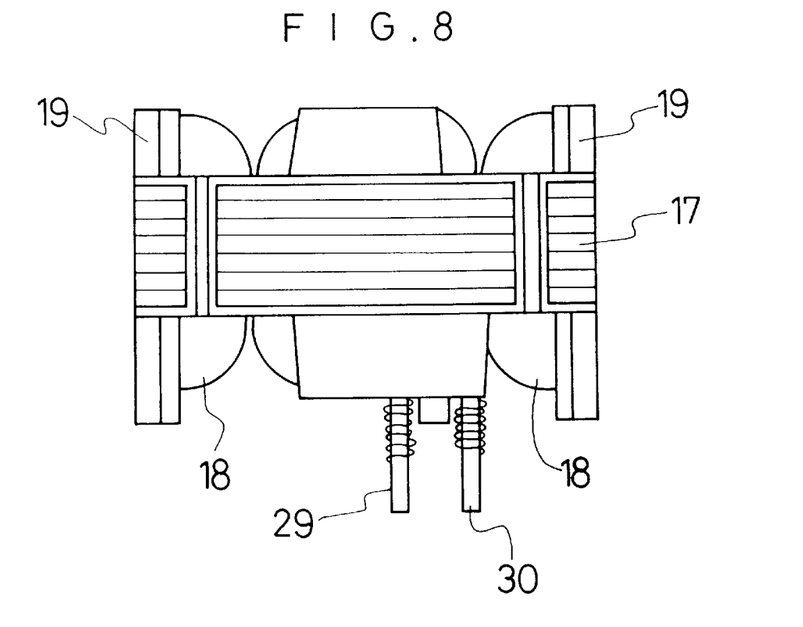
FIG. 8 is a frontal view shown in FIG. 7.

FIG. 6 shows an arrangement of the PC board 15 shown in FIG. 2 but includes a certain modification thereto. In this embodiment, the PC board 15 is also in the form of a semicircular shape with a concentric semicircular recess 15b. The recess 15b faces a part of the bearing box portion 3. As shown in FIGS. 7 and 8, the terminals 29 and 30 of the stator 20 are provided for one polarity of the stator 20. At the same time, holes 15c, 15d and 15e are formed at positions corresponding to the positions of the terminals 29, 30 and 31 and are connected to the respective circuits by soldering.

As is apparent from FIGS. 3 and 6, only the source terminals 21 and 22, the integrated circuit 25 and the hall device 27 are mounted on the PC board 15. The number of the components is remarkably reduced in comparison with that of conventional device shown in FIG. 11. According to the present invention, the functions of the components omitted in this invention may be substituted by employing by those mounted in the integrated circuit 25. The structure of the PC board 15 is made as shown in FIGS. 3 and 6, in which the parts arrangement on the PC board 15 may be superior in weight distribution and circuit structure, moreover, the mounting of the PC board 15 onto the stator 20 may be positively attained. Since it is preferable that the terminals 29 and 30 are located close to the hall device 27 in view of the circuit structure, the arrangement thereof meets the above requirement.

As described above, the thermal shutdown function is installed in the interior of the integrated circuit 25, and is operative in such a manner as the power supply to the load is cut off instantly to avoid any damage of the integrated circuit 25 when the temperature of the integrated circuit 25 reaches a predetermined level. According to the present invention, the integrated circuit 25 is operative in such a manner as the motor falls into a locked state due to certain causes so that an excessive current flows therethrough to thereby generate a heat, and then, the heat is transmitted to the integrated circuit 25, therefore, the power supply to the coils 18 are cut off. The operative temperature of the thermal shutdown function may be set as desired. In the present invention, it is set at a lower temperature by about 10° C. to 80° C. than a maximum allowable junction temperature (100° C. to 175° C.) which is generated at the time of the locked state of the motor.

In the thus constructed axial flow fan motor, when the source voltage is applied to the source terminals 21 and 22, the current is caused to flow through the coils 18 and 18 to rotate the impeller 9. The hall device 27 detects a magnetic field of the coils 18 and 18 and feeds signal obtained therefrom to the integrated circuit 25. The integrated circuit 25 controls the system so that a constant amount of current flows through the coils 18 and 18 in a constant direction. When the motor falls into a locked state due to some causes, so that an excessive current flows therethrough to generate a heat and the heat is transmitted to the integrated circuit 25, the power supply to the coils 18 are instantly cut off so that the damage of the integrated circuit 25 and the burnout of the coils 18 and 18 may be prevented.

In the foregoing embodiments, the PC board, which has been formed to a circular in conventional technique, is formed into a semicircular shape and the electronic parts are arranged on the surface of the PC board. However, the PC board 15 according to the present invention is not limited to a specific shape. It is possible that the PC board may be formed in arcuate shape whose area is within the range of 30% to 60% of the total area of the boss portion. Also, it is possible to provide various functions such as a rotational signal output, a locked state signal output, abnormal rotation signal output (when the operating RPM is reduced below a predetermined RPM) or the like to the integrated circuit 25. In this case, it is necessary to provide signal output terminals to the PC board 15.

The present invention relates to the axial flow fan motor which is structured as described above. The number of the parts is reduced by utilizing the functions provided in the integrated circuit. As a result, it is possible to successfully reduce the area of the PC board down to about half a conventional one. Thus, it is possible to curtail the cost and to make compact the overall structure while keeping the reliability and the necessary functions as it is. The shape of the PC board is formed in the arcuate shape whose area is within 30% to 60% of that of the conventional PC board, so that the same space as that of the PC board is made in the casing to thereby enhance the cooling property. Further, due to the utility of the thermal shutdown function provided with the integrated circuit, it is possible to prevent the burnout of the coil and the breakdown of the integrated circuit from being occurred when the rotation obstruction take place.

What we claim is:

1. An axial flow fan motor having an impeller mounted for rotation about an axis through a circular boss portion on a shaft rotatably supported by bearings, and rotation of the shaft being controlled by a power supply control of coils by an action of an integrated circuit through the coils, the circular boss portion having a diameter and extending radially to form a boss portion area defining a plane extending perpendicularly to the axis, the axial fan motor including a stator with a plurality of stator terminals connected to corresponding ones of the coils, the axial flow fan motor comprising:

a control circuit installed in a printed circuit board having an arcuate shape defining a circuit board area sized to be within approximately 30% to 60% of the boss portion area of the circular boss portion to create space for substantial airflow into the axial fan motor for cooling the coils, the printed circuit board being disposed wholly within the diameter of the circular boss portion wherein, the integrated circuit controls the power supply to the coils and includes a thermal shutdown component operative at an operating temperature selected from a range of temperatures being lower by approximately 10° C. to 80° C. than a maximum allowable junction temperature generated when an actuated motor becomes locked in a locked state to de-energize the motor and at least two of the plurality of stator terminals are provided at an outermost circumference of the stator and are disposed adjacent respective alternating ones of the coils, the printed circuit board having corresponding holes located for receiving the plurality of stator terminals.

* * * * *